United States Patent
Lee

(10) Patent No.: US 10,527,678 B2
(45) Date of Patent: Jan. 7, 2020

(54) APPARATUS AND METHOD FOR ESTIMATING STATE OF BATTERY USING BATTERY DEGRADATION MODELS

(71) Applicant: Samsung Electronics Co., Ltd., Suwon-si (KR)

(72) Inventor: Sun-Jae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 14/990,210

(22) Filed: Jan. 7, 2016

(65) Prior Publication Data

US 2016/0195587 A1    Jul. 7, 2016

(30) Foreign Application Priority Data

Jan. 7, 2015    (KR) .................. 10-2015-0001976

(51) Int. Cl.
  *G01R 31/36* (2019.01)
  *G01R 31/367* (2019.01)
  *G01R 31/392* (2019.01)

(52) U.S. Cl.
  CPC ......... *G01R 31/367* (2019.01); *G01R 31/392* (2019.01)

(58) Field of Classification Search
  CPC .............. G01R 31/3606; G01R 31/362; G01R 31/3651; G01R 31/3679; G01R 31/3658; G01R 31/3662
  USPC .......................................................... 702/63
  See application file for complete search history.

(56) References Cited

U.S. PATENT DOCUMENTS

| 8,519,674 | B2 * | 8/2013 | Anderson | .......... G01R 31/3679 320/127 |
| 9,599,584 | B2 * | 3/2017 | Yazami | .................. G01N 27/27 |
| 9,653,759 | B2 * | 5/2017 | Coates | ................... H01M 10/42 |
| 2011/0112781 | A1 * | 5/2011 | Anderson | .......... G01R 31/3679 702/63 |
| 2012/0105001 | A1 | 5/2012 | Gallegos et al. | |
| 2012/0123618 | A1 * | 5/2012 | Kinser | ..................... B60L 11/14 701/22 |
| 2012/0296586 | A1 | 11/2012 | Kirchev | |
| 2013/0322488 | A1 * | 12/2013 | Yazami | .................. G01N 27/27 374/142 |
| 2014/0097787 | A1 | 4/2014 | Lin | |
| 2014/0167780 | A1 | 6/2014 | White et al. | |
| 2016/0146895 | A1 * | 5/2016 | Yazami | ................... B60L 1/003 324/426 |
| 2017/0108552 | A1 * | 4/2017 | Roumi | ............... G01R 31/3651 |
| 2017/0246963 | A1 * | 8/2017 | Lee | ..................... B60L 11/1846 |

FOREIGN PATENT DOCUMENTS

| JP | 2013-225441 A | 10/2013 |
| KR | 10-2011-0015881 A | 2/2011 |
| KR | 10-2012-0120889 A | 11/2012 |
| KR | 10-2013-0073802 A | 7/2013 |
| KR | 10-2013-0089360 A | 8/2013 |
| KR | 10-2013-0091475 A | 8/2013 |

* cited by examiner

*Primary Examiner* — Gene N Auduong
(74) *Attorney, Agent, or Firm* — NSIP Law

(57) ABSTRACT

An apparatus and method for estimating state information of a battery are provided. The apparatus may estimate the state information from information, obtained by classifying and preprocessing battery information measured by a battery management system (BMS), using a pre-trained battery degradation model.

25 Claims, 9 Drawing Sheets

APPARATUS AND METHOD FOR ESTIMATING STATE OF BATTERY USING BATTERY DEGRADATION MODELS

CROSS-REFERENCE TO RELATED APPLICATION(S)

This application claims the benefit under 35 USC 119(a) of Korean Patent Application No. 10-2015-0001976 filed on Jan. 7, 2015, in the Korean Intellectual Property Office, the entire disclosure of which is incorporated herein by reference for all purposes.

BACKGROUND

1. Field

The following description relates to a technology for estimating a state of a battery pack.

2. Description of Related Art

In an electronic device (for example, an electric vehicle (EV), or a mobile phone) using electricity as an energy source, a rechargeable and dischargeable battery, e.g., referred to as a secondary battery or power source, may be used. The secondary battery may include, as only an example, a lithium (Li)-ion secondary battery based on Li ions. Such Li-ion secondary batteries may have high capacities for their weight and provide a high energy output.

As an apparatus including a secondary battery is frequently used, the life of the secondary battery may become reduced. Due to a reduction in the life of the secondary battery, an initial battery capacity is not guaranteed. Rather the battery capacity is gradually reduced. In addition, when heat of a such a Li-ion secondary battery is carelessly managed, a risk of explosion may exist.

When a capacity of a battery continues to decrease as described above, user desired power, operating time, and stability may not be provided. Accordingly, replacement of the battery may then be required. In this example, a technology that accurately determines a state of the battery may be useful to determine when to replace the battery.

SUMMARY

This Summary is provided to introduce a selection of concepts in a simplified form that are further described below in the Detailed Description. This Summary is not intended to identify key features or essential features of the claimed subject matter, nor is this Summary intended to be used as an aid in determining the scope of the claimed subject matter.

One or more embodiments provide an apparatus configured to determine state information of a battery pack having a plurality of battery cells, the apparatus including a battery state determiner configured to determine the state information of the battery pack, based on received battery information of the battery pack, using a battery degradation model that is pre-trained on at least one attribute associated with the received battery information.

The apparatus may include a battery information classifier configured to classify the received battery information corresponding to a predetermined period among the received battery information, wherein the battery state determiner is configured to estimate the state information from the classified battery information.

The battery information classifier may be configured to perform at least one of clustering of the received battery information, in a unit of a predetermined data size, and archiving of the received battery information in a predetermined time unit.

The battery degradation model may include a first degradation model trained on a distribution attribute associated with the received battery information based on reference distribution information obtained by partitioning previously received battery information from the battery into at least one predetermined section and accumulating the at least one predetermined section, and wherein the battery state determiner may include a preprocessor configured to generate distribution information by partitioning the received battery information into the at least one predetermined section and accumulating the at least one predetermined section, and a state estimator configured to estimate the state information from the generated distribution information using the first degradation model.

The battery degradation model may include a second degradation model trained on a time attribute associated with the received battery information based on reference segment information obtained by partitioning previously received battery information from the battery into predetermined time segments, and wherein the battery state determiner may include a preprocessor configured to generate segment information by partitioning the received battery information into the predetermined time segments, and a state estimator configured to estimate the state information from the generated segment information using the second degradation model.

The battery degradation model may include a third degradation model trained on a frequency attribute associated with the received battery information based on reference frequency information obtained by converting previously received battery information from the battery from a time domain to a frequency domain, and wherein the battery state determiner may include a preprocessor configured to generate frequency information by converting the received battery information from a time domain to a frequency domain, and a state estimator configured to estimate the state information from the generated frequency information using the third degradation model.

The battery degradation model may include one or more of a first degradation model, a second degradation model, and a third degradation model, wherein the first degradation model may be trained on a distribution attribute, associated with the received battery information, based on reference distribution information obtained by partitioning previously received battery information into at least one predetermined section and accumulating the at least one predetermined section, the second degradation model may be trained on a time attribute, associated with the received battery information, based on reference segment information obtained by partitioning the previously received battery information into predetermined time segments, and the third degradation model may be trained on a frequency attribute, associated with the received battery information, based on reference frequency information obtained by converting the previously received battery information from a time domain to a frequency domain.

One or more embodiments include a method of determining state information of a battery, the method including receiving battery information of a battery pack including a plurality of battery cells, and determining the state information based on the received battery information using a battery degradation model pre-trained on at least one attribute associated with the received battery information.

The method may further include classifying the received battery information corresponding to a predetermined period among the received battery information, wherein the determining may include estimating the state information from the classified battery information.

The classifying may include performing at least one of clustering of the received battery information in a unit of a predetermined data size and archiving of the received battery information in a predetermined time unit.

The determining may include generating distribution information by partitioning the received battery information into at least one predetermined section and by accumulating the at least one predetermined section, and estimating the state information from the generated distribution information using a first degradation model trained on a distribution attribute, from previously received battery information, associated with the received battery information.

The determining may include generating segment information by partitioning the received battery information into predetermined time segments, and estimating the state information from the generated segment information using a second degradation model trained on a time attribute, from previously received battery information, associated with the received battery information.

The determining may include generating frequency information by converting the received battery information from a time domain to a frequency domain, and estimating the state information from the generated frequency information using a third degradation model trained on a frequency attribute, from previously received battery information, associated with the received battery information.

One or more embodiments include an apparatus configured to estimate state information of a battery, the apparatus including a communicator configured to communicate with a battery management system (BMS), and a processor configured to execute instructions to perform an operation of receiving battery information from the BMS using the communicator and determining the state information of the battery based on the received battery information using a battery degradation model pre-trained on at least one attribute associated with the received battery information.

The apparatus may further include the BMS configured to measure battery information associated with a battery pack including a plurality of battery cells and configured to transmit the measured battery information to the communicator, the BMS including the battery pack.

The BMS may include a battery information measurer configured to measure at least one of a voltage, a current, and a temperature of each of the plurality of battery cells.

The processor may be configured to drive a computing platform configured to control the apparatus to execute the instructions.

The processor may be configured to update at least one of the instructions and the battery degradation model, in response to an update signal.

The processor may be configured to execute instructions to perform an operation of generating distribution information by partitioning the received battery information into at least one predetermined section and accumulating the at least one predetermined section and of estimating the state information from the generated distribution information using a first degradation model trained on a distribution attribute, from previously received battery information, associated with the received battery information.

The processor may be configured to execute instructions to perform an operation of generating segment information by partitioning the received battery information into predetermined time segments and of estimating the state information from the generated segment information using a second degradation model trained on a time attribute, from previously received battery information, associated with the received battery information.

The processor may be configured to execute instructions to perform an operation of generating frequency information by converting the received battery information from a time domain to a frequency domain and of estimating the state information from the generated frequency information using a third degradation model trained on a frequency attribute, from previously received battery information, associated with the received battery information.

Other features and aspects will be apparent from the following detailed description, the drawings, and the claims.

Figure 1:
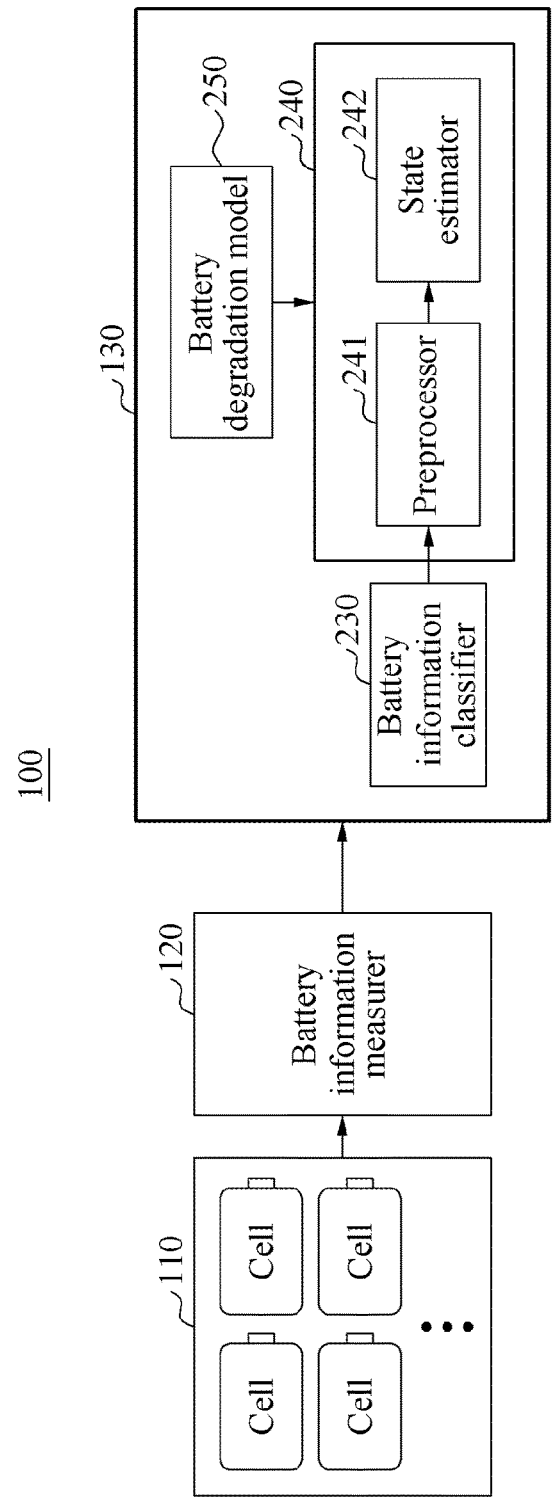
FIG. 1 illustrates an apparatus configured to estimate state information of a battery, according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that may be well known to one of ordinary skill in the art may be omitted for increased clarity and conciseness.

The features described herein may be embodied in different forms, and are not to be construed as being limited to the examples described herein.

Various alterations and modifications may be made to the exemplary embodiments, some of which will be illustrated in detail in the drawings and detailed description. However, it should be understood that these embodiments are not construed as limited to the illustrated forms and include all changes, equivalents or alternatives within the idea and the technical scope of this disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs, in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, exemplary embodiments will be described in detail with reference to the accompanying drawings, wherein like reference numerals refer to like elements throughout. When it is determined a detailed description of a related known function or configuration may make a purpose of an embodiment of the present disclosure unnecessarily ambiguous in describing an embodiment, the detailed description may be omitted herein.

FIG. 1 illustrates an apparatus 100 configured to estimate state information of a battery, according to one or more embodiments.

In the present disclosure, battery state information of a battery may include, for example, information associated with a battery life and information associated with a malfunction. The information associated with the battery life may include, for example, a state of health (SOH), a state of charge (SOC) or a remaining useful life (RUL). The SOH may be represented as a ratio of a current battery capacity to an initial battery capacity. The information associated with the malfunction refers to information indicating whether a battery malfunctions, and may include, for example, information associated with an example in which a current, a voltage, and a temperature of a battery are extremely high or low. In the following description, a battery life will be described as an example of battery state information, however, there is no limitation thereto.

Referring to FIG. 1, the apparatus 100 includes a battery pack 110, a battery information measurer 120, and an apparatus 130 determining the state information of the battery.

A battery management system (BMS) senses data of any or any combination of a voltage, a current, and a temperature measured from the battery, as only non-limiting examples, and manages the example voltage, current, and/or the temperature. The BMS may include an electrical safety device configured to additionally cut off a high voltage and a high current. For example, when a lithium (Li)-ion battery is used as a secondary battery, the BMS may manage the Li-ion battery to reduce a risk of explosion of the Li-ion battery. Also, to increase the life of the battery, the BMS may estimate an SOC and an SOH, manage the temperature of the battery, and perform multi-cell balancing.

In an example, the BMS may include, or be represented by, the battery pack 110 and the battery information measurer 120. In another example, the BMS may include, or be represented by, the battery pack 110, the battery information measurer 120, and the apparatus 130. Thus, apparatus 130 may be positioned in or outside the BMS, depending on embodiment. In the present disclosure, the apparatus 130 will be discussed as being positioned outside the BMS, however, there is no limitation thereto.

For example, when the BMS includes the battery pack 110, and when a few battery cells are included in the battery pack 110, a simple circuit may be added to the BMS and a battery life (for example, an SOC or an SOH) may be estimated. In this example, the BMS may not manage a history of data measured from the battery. Due to a low specification or complexity of this example BMS, the BMS may estimate an SOC or an SOH of the battery by performing a simple operation. When a few battery cells are included in the battery pack 110, the BMS with such a low specification or complexity may accurately estimate the battery life. However, when the battery pack 110 has a high capacity, for example, and includes a large number of battery cells, it may be difficult for such a BMS with the low specification or complexity to accurately estimate the battery life.

Additionally, because such a BMS does not manage a history of data associated with the battery, errors that are being continuously accumulated in the battery information measurer 120 may not be addressed by the BMS. Due to the accumulated errors, there is a decrease in accuracy of estimating the battery life using only such a BMS.

The battery pack 110 includes a plurality of battery cells. Each of the battery cells may have a small volume and a high capacity for a price of each of the battery cells. The battery pack 110 may thus have a high output and a high capacity for a price of the battery pack 110. For example, the battery pack 110 may include thousands of battery cells. However, a number of battery cells included in the battery pack 110 may not be limited thereto, and may be changed depending on embodiment.

For example, when a plurality of battery cells each have a small volume and a low price for their respective capacities, the battery pack 110 including the battery cells may thereby have a high capacity at a relatively low price and may be applied to an electronic device embodiment. When a number of battery cells in the battery pack 110 increases, a degradation level of a capacity of each of the battery cells may change, which may cause the life of the battery pack 110 to change. In the present disclosure, the terms "battery" and "battery pack" may be used interchangeably with respect to each other.

The battery information measurer 120 measures battery information from each, for example, of the battery cells in the battery pack 110. The battery information may include, as only examples, a temperature of the battery, or a voltage and current output from the battery. For example, the battery information measurer 120 may include a master unit and a slave unit. In this example, in an embodiment, when the slave unit collects a predetermined number of pieces of measured data, the master unit may combine and manage the collected data as battery information.

In the present disclosure, the battery information may include data measured from each, for example, of a plurality of battery cells. The measured data may include, for example, any or any combination of a voltage signal value, a current signal value, and a temperature signal value that are measured at an arbitrary point in time, noting that alternative embodiments are also available.

The apparatus 130 includes a receiver, a battery information classifier 230, and a battery state determiner 240, for example. The apparatus 130 may store a battery degradation model 250 in a memory.

For example, the apparatus 130 may learn, using machine learning, reference battery information collected in advance from the battery, e.g., predetermined reference battery information, and may estimate the state information of the battery from battery information associated with the battery pack 110 with a high capacity based on a result of the learning.

In the present disclosure, the machine learning and a machine learning algorithm may refer to an operation or process of training a learner to output reference state information corresponding to the reference battery information based on the reference battery information. For example, the learner may include one of machine learning structures, for example, a neural network, a hidden Markov model (HMM), a Bayesian network, a support vector machine (SVM), and a decision tree (DT).

A result, e.g., a battery degradation model, obtained by training the learner may be transferred to an estimator configured to output state information based on input battery information. The estimator may have the same machine learning structure as the above-described learner. The result may be, for example, a parameter of the machine learning structure. The machine learning structure may be expressed by, for example, a function to generate an arbitrary output based on a parameter of a predetermined input.

The reference battery information includes information of a current, a voltage, and a temperature, for example, that change based on a charge and discharge profile of the battery, life information corresponding to the current, the voltage, and the temperature, and malfunction information. The charge and discharge profile may be, for example, a kind of scenario of charging and discharging the battery. The reference battery information is used in machine learning, and includes, for example, simulated battery information or battery information collected in advance from a usage history of the battery by an arbitrary user.

The apparatus 130 may use a universal model of the battery learned using the machine learning. The universal model may be, for example, a model trained on reference battery information collected in advance from an arbitrary battery, without a limitation to a predetermined type of batteries.

To estimate the state information of the battery, the apparatus 130 may classify battery information measured from the battery pack 110 including a plurality of battery cells with a high output and a high capacity, and may preprocess the battery information. Classifying and preprocessing of battery information will be further described below.

The receiver receives battery information of a battery pack including a plurality of battery cells from the battery information measurer 120. For example, the receiver may operate similarly to a communicator 1061 of FIG. 9.

The battery information classifier 230 classifies the battery information received from the battery information measurer 120. For example, the battery information classifier 230 may classify the battery information, based on a point in time when the battery information is measured, a quantity of the battery information, and a characteristic of the battery information. The classifying of the battery information indicates arranging and sorting battery information randomly collected from a plurality of battery cells based on a predetermined rule.

The battery state determiner 240 estimates the state information based on the classified battery information. For example, when battery information of a battery pack including a plurality of battery cells is received, the battery state determiner 240 may determine the state information based on the battery information using the battery degradation model 250 pre-trained on at least one attribute of the battery information. The attribute may include, for example, any or any combination of a time attribute, a distribution attribute, and a frequency attribute of the battery information, however, there is no limitation thereto. The battery state determiner 240 includes a preprocessor 241 and a state estimator 242, for example, as shown in FIG. 1.

The preprocessor 241 preprocesses the battery information classified by the battery information classifier 230.

The preprocessing refers to an operation of converting the battery information to data applicable to the battery degradation model 250. The preprocessing of the battery information may include, for example, partitioning the battery information in a predetermined unit. The partitioned battery information may include, for example, a pattern corresponding to a predetermined charge and discharge environment and a predetermined usage history of a user. The pattern may show, for example, a characteristic change in a current signal when a battery is rapidly discharged.

The partitioning of the battery information may include, for example, vertically partitioning the battery information in a time series, and horizontally partitioning the battery information to acquire a histogram of the battery information.

The state estimator 242 estimates the state information from the preprocessed battery information, using the pre-trained battery degradation model 250. For example, the state estimator 242 may input the preprocessed battery information to an estimator including the battery degradation model 250 as a parameter so that the estimator may output the state information.

In an embodiment, the same quantity of state information as a quantity of battery information classified by the battery information classifier 230 may be estimated. For example, when the battery information classifier 230 classifies battery information collected during a predetermined period into n groups in which n is an integer equal to or greater than "1," the state estimator 242 may estimate state information corresponding to each of the n groups. The state estimator 242 may calculate a statistical value (for example, an average value, a minimum value or a maximum value) of the estimated state information as final battery state information.

The battery degradation model 250 is a model applicable to the machine learning, and includes, for example, a model used to output a degree of degradation in a state of a battery (for example, battery life or malfunction) due to an arbitrary factor. The battery degradation model 250 is a parameter of a machine learning structure. For example, when a neural network is used as a machine learning structure, the battery degradation model 250 may be a connection weight between nodes in the neural network. The battery degradation model 250 may include a parameter of a learner trained to output reference state information corresponding to reference battery information based on the reference battery information, in a given machine learning structure. The reference state information may be, for example, state information of a battery with corresponding reference battery information in an existing profile.

Operations of the battery information classifier 230 and the battery state determiner 240 may be performed by a processor.

Figure 2:
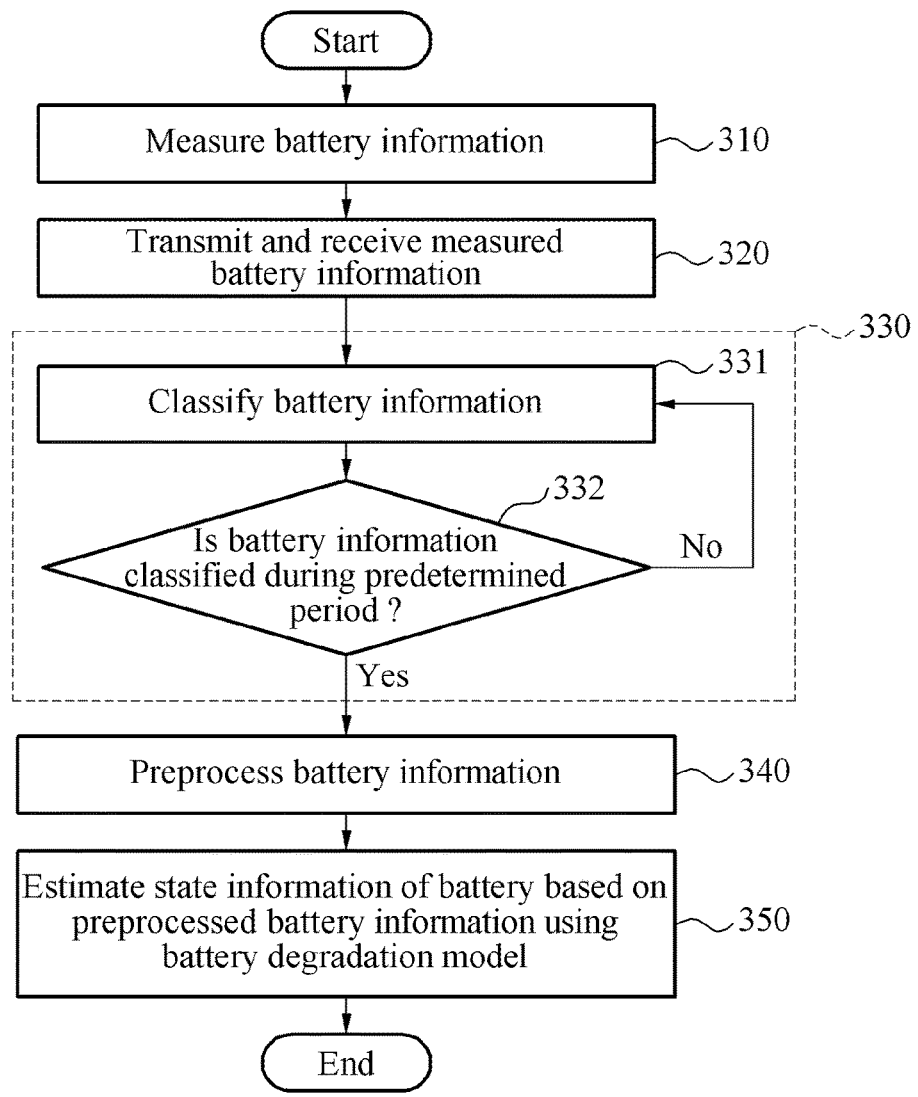
FIG. 2 illustrates an example of a method of estimating state information of a battery, according to one or more embodiments.

FIG. 2 illustrates an example of a method of estimating state information of a battery, according to one or more embodiments.

Referring to FIG. 2, in operation 310, battery information of a battery pack is measured. As only an example, the battery information measurer 120 of FIG. 1 may measure any or any combination of a current, a voltage, and a temperature of each, for example, of a plurality of battery cells in the battery pack.

In operation 320, the measured battery information is transmitted, e.g., via a data communicator that will be described with reference to FIG. 9. In operation 330, the battery information may be classified. As only an example, the battery information classifier 230 of FIG. 1 may classify the battery information during a predetermined period.

Thus, in operation 331, the battery information may be classified in response to the battery information being received, e.g., by the battery information classifier 230. In operation 332, a determination may be made as to whether the battery information is classified during a predetermined period. When the predetermined period has not yet elapsed, the battery information may continue to be classified in operation 331.

In an example, the battery information classifier may classify battery information corresponding to a predetermined period among the battery information. The battery information classifier may classify the battery information, for example, based on a time and a unit of voltage, current, and temperature. The classifying of the battery information may be performed to divide the battery information to be processed by a processor, because a large quantity of data corresponding to battery information may be measured from the plurality of battery cells. For example, when a large number of battery cells (for example, about ten thousand battery cells) are included in a battery pack, processing all data measured from individual battery cells may be inefficient. Accordingly, the battery information classifier may divide the battery information to include an appropriate number of pieces of measured data.

In another example, the battery information classifier may cluster the battery information in a unit of a predetermined data size. When a single cluster is assumed to include 100 pieces of measured data, a statistical value (for example, an average) of the 100 pieces of measured data may be used as a representative value of the cluster. The cluster may be processed as a single piece of data using the representative value. An identification (ID) may be assigned to each cluster. Based on a performance of a processor, a size of a cluster (for example, a number of pieces of measured data in a cluster) may change.

In still another example, the battery information classifier may archive the battery information in a predetermined time unit. For example, the battery information classifier may record and store measured data together with time information matched to the measured data. Also, the battery information classifier may chronologically arrange the measured data based on the time information. The time information may include, for example, a point in time and a date when the measured data is obtained. The battery information classifier may archive the battery information so that the battery information may include measured data corresponding to a predetermined time unit (for example, monthly, weekly or daily).

In yet another example, the battery information classifier may perform an operation including the clustering and the archiving, and may classify the battery information.

In operation 340, the classified battery information may be preprocessed. As only an example, the preprocessor 241 of FIG. 1 may convert the battery information into a data format applicable or appropriate to a battery degradation model. In addition, the preprocessor may perform a filtering operation to reduce noise occurring in the battery information.

In an example, the preprocessor may define in advance predetermined sections in a range in which the battery information is measured. When data corresponding to the sections is measured, the preprocessor may generate distribution information by counting the sections and accumulating a number of the sections. The distribution information refers to a histogram of the battery information, and includes a pattern (for example, a distribution attribute) represented in a predetermined section. The distribution information will be further described with reference to FIGS. 3 and 4.

In another example, the preprocessor may generate segment information corresponding to each segment of the battery information within a predetermined period while sliding by segment intervals with a segment size. The segment information refers to information obtained by preprocessing the battery information in a chronological order, and includes a time series characteristic (for example, a time attribute) based on use of the battery. The segment information will be further described with reference to FIGS. 5 and 6.

In still another example, the preprocessor may generate frequency information by converting the battery information from a time domain to a frequency domain. The frequency information refers to battery information converted from a time domain to a frequency domain, and includes a frequency attribute. The frequency information may include, for example, an amplitude and a period of the battery information. The frequency information will be further described with reference to FIGS. 7 and 8.

In operation 350, the state information may be estimated from the preprocessed battery information using the battery degradation model. As only an example, the state estimator 242 of FIG. 1 may be configured to input the preprocessed battery information, so that the state estimator may output the state information. The state estimator is configured to use the battery degradation model as a parameter.

Figure 3:
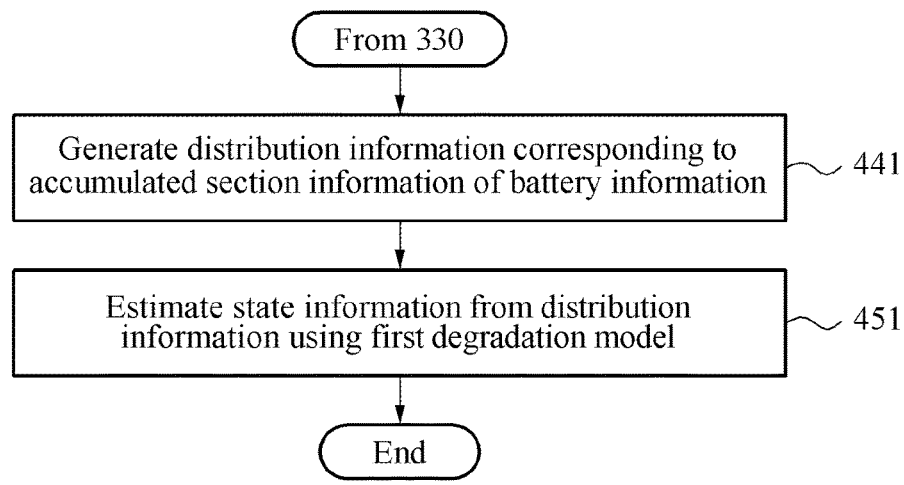
FIG. 3 illustrates an example of estimating state information based on distribution information of battery information, such as in the method of FIG. 2, according to one or more embodiments.

FIG. 3 illustrates an example of estimating state information based on distribution information of battery information, such as the battery information in the method of FIG. 2, according to one or more embodiments.

Referring to FIG. 3, in operation 441, distribution information corresponding to accumulated section information of the battery information may be generated. As only an example, the preprocessor 241 of FIG. 1 may generate distribution information by partitioning the battery information into at least one predetermined section and accumulating the at least one predetermined section. The section information refers to information obtained by accumulating data measured in a predetermined section during a predetermined period. The distribution information refers to a set of section information corresponding to at least one section. For example, the distribution information may include a distribution vector representing a set of pieces of section information in the form of a vector. In this example, each of the pieces of section information may be an element of the distribution vector.

In operation 451, the state information may be estimated from the distribution information using a first degradation model. As only an example, the state estimator 242 of FIG. 1 may perform an operation of outputting the state information based on the distribution information using the first degradation model as a parameter of the state estimator.

The first degradation model refers to a battery degradation model trained on a distribution attribute of the battery information based on reference distribution information. The reference distribution information refers to information obtained by partitioning reference battery information collected in advance, e.g., as archived previously measured battery information, from the battery into at least one predetermined section and by accumulating the at least one predetermined section. The distribution attribute refers to a characteristic indicating that the battery information is distributed to predetermined sections, and may be represented by, for example, a histogram. For example, the first degradation model may include a parameter of a learner trained to output reference state information corresponding to the reference distribution information based on the reference distribution information. The first degradation model may be used as a parameter of the state estimator.

Figure 4:
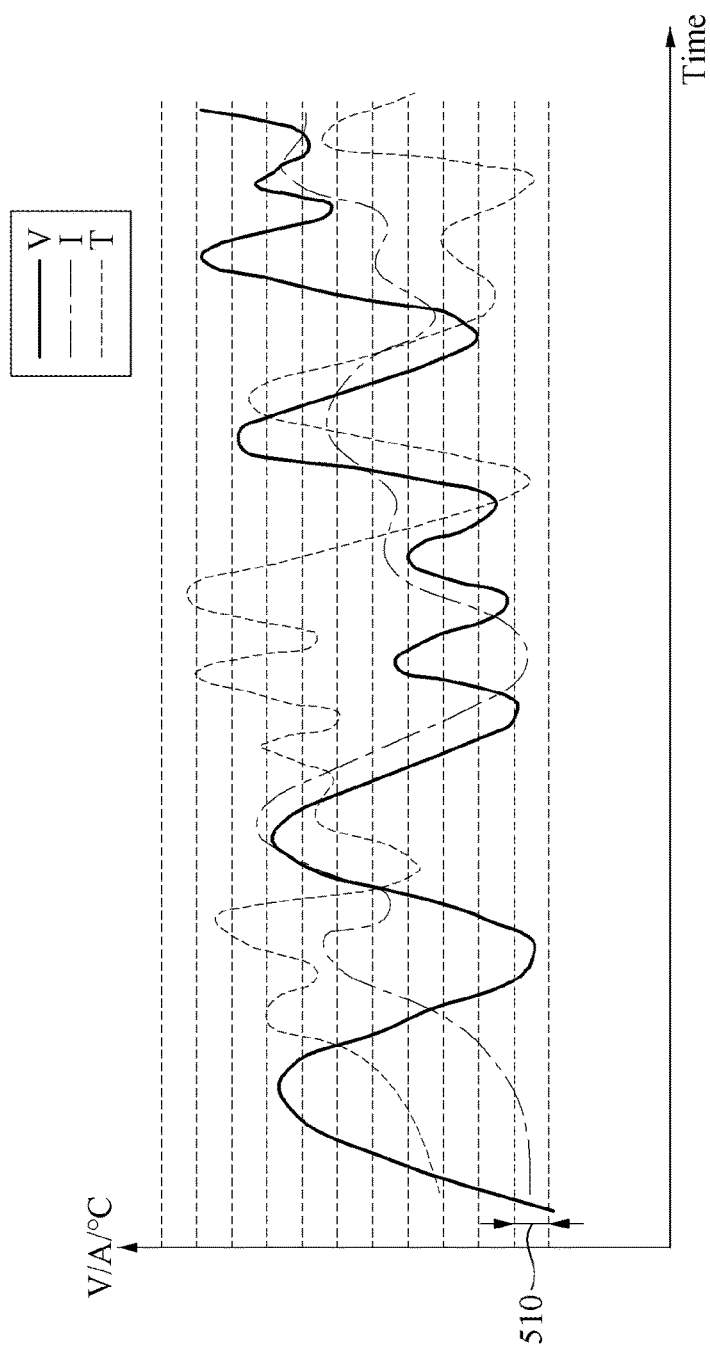
FIG. 4 illustrates an example of distribution information of battery information, according to one or more embodiments.

FIG. 4 illustrates an example of distribution information of battery information, according to one or more embodiments.

In FIG. 4, a voltage signal, a current signal, and a temperature signal of a battery as collected battery information are illustrated with respect to a horizontal axis representing time. Additionally, horizontal dashed lines represent sections into which the battery information is partitioned, and a vertical axis represents a voltage level, a current level, and a temperature level of the battery.

The preprocessor may count and accumulate an amount of time during which data corresponding to a predetermined section 510 among classified battery information is measured and a number of times the data is measured. Section information accumulated for each section in the battery information may be an amount of time during which the battery is used in a corresponding section within a predetermined period or a number of times the battery is used in a corresponding section within the predetermined period. For example, the battery is used twice in the section 510 of FIG. 4.

The preprocessor may generate the section information as distribution information. The distribution information may be represented as a distribution vector with a form of a vector. For example, an element of the distribution vector may correspond to section information.

In the present disclosure, "adding an amount of time" during which battery information (for example, measured data) corresponding to a predetermined section is measured to an element of a distribution vector (for example, section information) corresponds to "accumulating section information."

Figure 5:
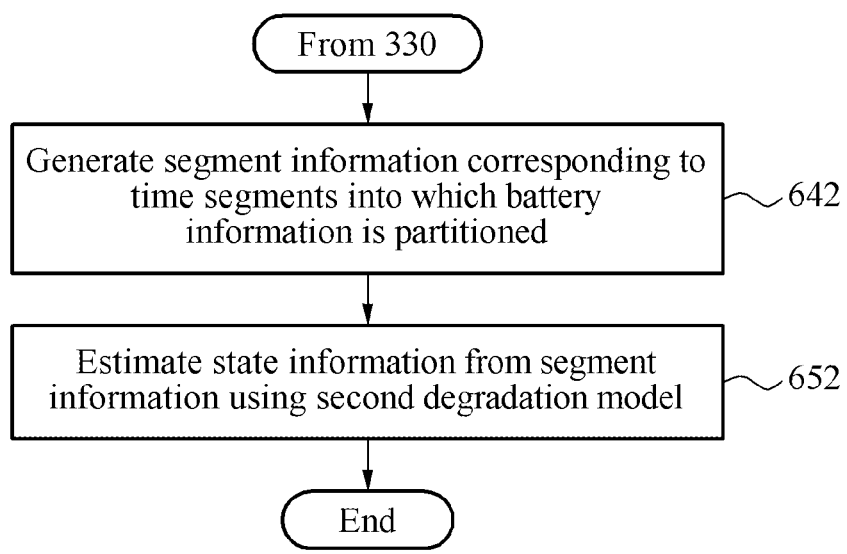
FIG. 5 illustrates an example of estimating state information based on segment information of battery information, such as in the method of FIG. 2, according to one or more embodiments.

FIG. 5 illustrates an example of estimating state information based on segment information of battery information, such as the battery information in the method of FIG. 2, according to one or more embodiments.

Referring to FIG. 5, in operation 642, segment information corresponding to time segments into which the battery information is partitioned may be generated. As only an example, the preprocessor 241 of FIG. 1 may partition the battery information into predetermined time segments, and may generate segment information. The segment information includes values of data measured at each point in time in the time segments into which the battery information is partitioned. For example, the segment information may include a segment vector representing values measured at each point in time in the time segments.

In operation 652, the state information from the segment information may be estimated using a second degradation model. As only an example, the state estimator 242 of FIG. 1 may perform an operation of outputting the state information based on the segment information using the second degradation model as a parameter of the estimator.

The second degradation model refers to a battery degradation model trained on a time attribute of the battery information based on reference segment information. The reference segment information refers to information obtained by partitioning reference battery information collected in advance, e.g., as archived previously measured battery information, from the battery into predetermined time segments. The time attribute refers to a time series characteristic of the battery information during use of the battery. For example, the second degradation model may include a parameter of a learner trained to output reference state information corresponding to the reference segment information based on the reference segment information. The second degradation model may be used as a parameter of the state estimator.

Figure 6:
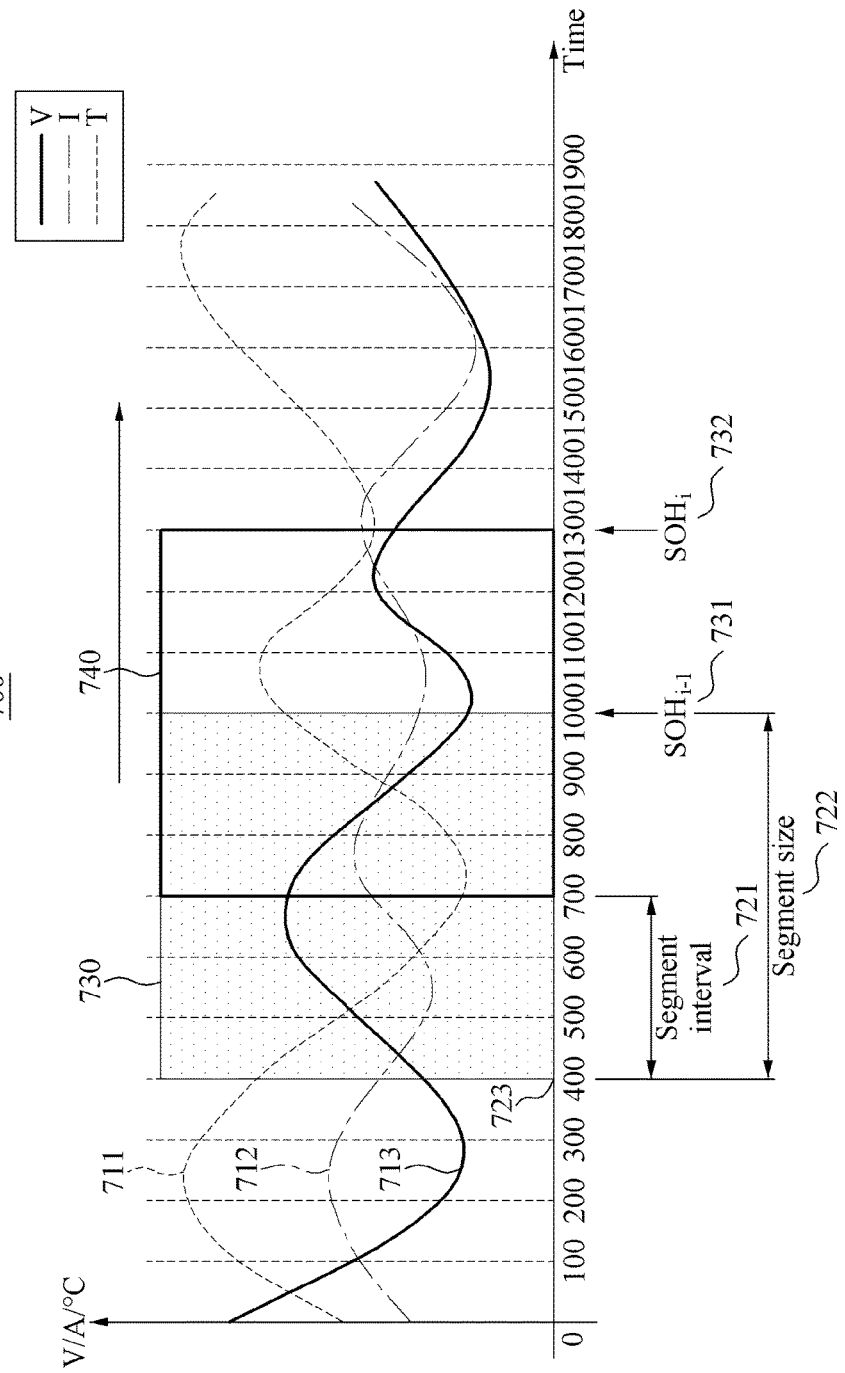
FIG. 6 illustrates an example of segment information of battery information, according to one or more embodiments.

FIG. 6 illustrates an example of segment information of battery information, according to one or more embodiments.

Referring to FIG. 6, a graph 700 shows a change in a state of a battery, in response to the battery being partially charged and discharged. In the graph 700, a horizontal axis represents time, and a vertical axis represents a voltage level, a current level, and a temperature level of the battery.

A preprocessor partitions measured data, that is, voltage data 713, current data 712, and temperature data 711 at predetermined time intervals. In FIG. 6, the preprocessor partitions the measured data at intervals of "100" seconds (sec). The preprocessor extracts a plurality of time segments in a time series based on a predetermined segment gap. The time segments each include a predetermined number of pieces of measured data included in partitioned battery information. A segment size 722 indicates a predetermined number of pieces of measured data, and a segment interval 721 indicates a predetermined gap between time segments. When the segment size 722 corresponds to pieces of measured data and when the segment interval 721 corresponds to "300" sec as shown in FIG. 6, the preprocessor extracts time segments sequentially after a point in time 723 set to "400" sec.

A first time segment 730 extracted first by the preprocessor includes seven pieces of measured data corresponding to a period from "400" sec to "1,000" sec (for example, values measured every "100" sec during the period from "400" sec to "1,000" sec). Additionally, a second time segment 740 extracted second by the preprocessor includes seven pieces of measured data corresponding to a period from "700" sec to "1,300" sec (for example, values measured every "100"

sec during the period from "700" sec to "1,300" sec). Because a number of pieces of measured data corresponding to the segment interval 721 is lower than the segment size 722, both the first time segment 730 and the second time segment 740 include four pieces of the measured data (for example, values measured every "100" sec during a period from "700" sec to "1,000" sec).

A state estimator estimates state information corresponding to each time segment. In FIG. 6, the state estimator estimates state information (for example, an $SOH_{i-1}$ 731) corresponding to the first time segment 730 and state information (for example, an $SOH_i$ 732) corresponding to the second time segment 740, as only examples.

Figure 7:
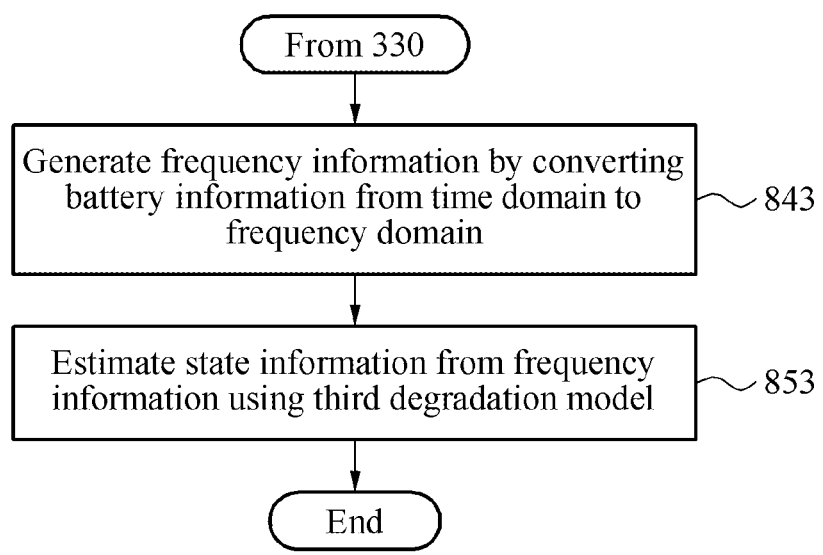
FIG. 7 illustrates an example of estimating state information based on frequency information of battery information, such as in the method of FIG. 2, according to one or more embodiments.

FIG. 7 illustrates an example of estimating state information based on frequency information of battery information, such as the battery information in the method of FIG. 2, according to one or more embodiments.

Referring to FIG. 7, in operation 843, frequency information may be generated, e.g., by the preprocessor 241 of FIG. 1, by converting the battery information from a time domain to a frequency domain. The frequency information includes information associated with an amplitude measured when the battery information is converted from the time domain to the frequency domain, and associated with a frequency matched to the amplitude.

In operation 853, state information is estimated from the frequency information using a third degradation model. As only an example, the state estimator 242 of FIG. 1 may perform an operation of outputting the state information based on the frequency information using the third degradation model as a parameter of the state estimator.

The third degradation model refers to a battery degradation model trained on a frequency attribute of the battery information based on reference frequency information. The reference frequency information refers to information obtained by converting reference battery information collected in advance, e.g., as archived previously measured battery information, from the battery from a time domain to a frequency domain. The frequency attribute refers to a frequency characteristic indicating that the battery information corresponds to a predetermined amplitude at a predetermined frequency during use of the battery. For example, the third degradation model may include a parameter of a learner trained to output reference state information corresponding to the reference frequency information based on the reference frequency information. The third degradation model may be used as a parameter of the estimator.

Figure 8:
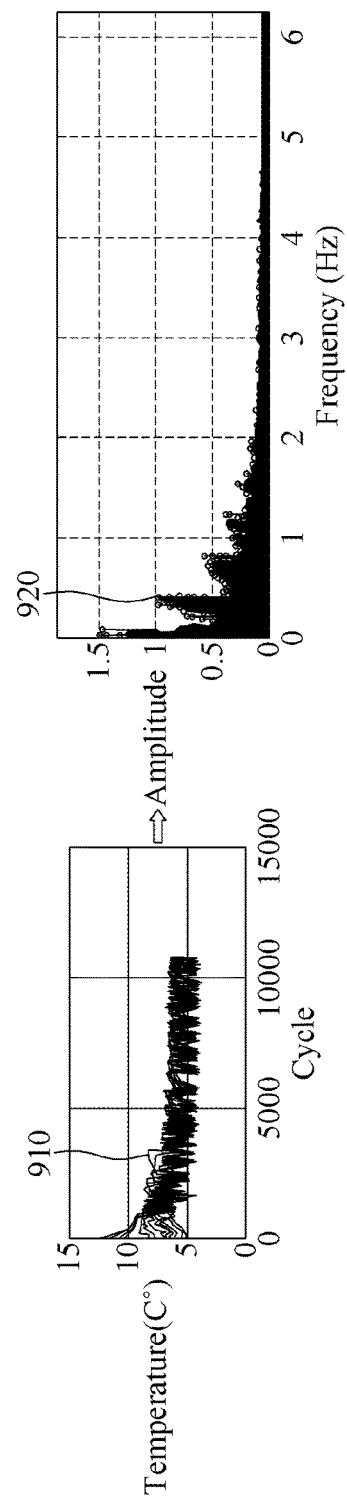
FIG. 8 illustrates an example of frequency information of battery information, according to one or more embodiments.

FIG. 8 illustrates an example of frequency information of battery information, according to one or more embodiments.

A left graph of FIG. 8 shows a temperature signal 910 among battery information based on a cycle of a battery represented by a horizontal axis. In the example of FIG. 8, a temperature of a battery cell is managed within a predetermined range (for example, around 5 degrees) in an external environment with a low temperature. During the cycle, the battery is fully discharged after being fully charged.

The temperature signal 910 is converted into a frequency signal 920 in a frequency domain by a preprocessor as shown in a right graph of FIG. 8. In the right graph of FIG. 8, a horizontal axis represents a frequency in hertz (Hz), and a vertical axis represents an amplitude. The frequency signal 920 has a frequency below "5" Hz and an amplitude of "0" to "1.5." The frequency signal 920 may be generated by the preprocessor as frequency information with an amplitude and a frequency corresponding to the amplitude. The frequency information may be represented as, for example, a vector.

Figure 9:
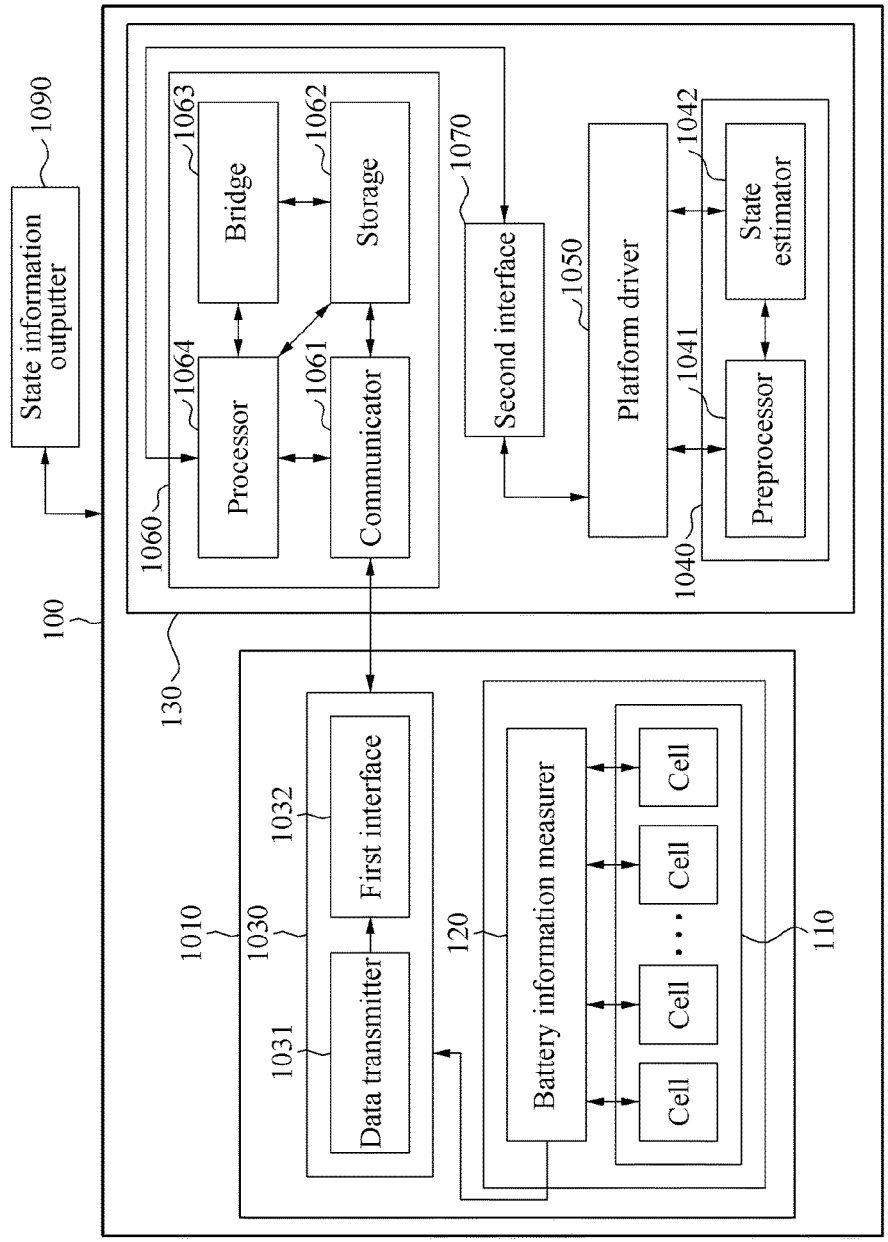
FIG. 9 illustrates an apparatus configured to estimate state information of a battery, according to one or more embodiments.

FIG. 9 illustrates the apparatus 100 configured to estimate state information of a battery, according to one or more embodiments.

Referring to FIG. 9, the apparatus 100 includes a BMS 1010 and an apparatus 130 that determines state information of a battery.

The BMS 1010 includes a battery pack 110, a battery information measurer 120, and a data communicator 1030, for example. The battery pack 110 and the battery information measurer 120 of FIG. 9 operate similarly to those described above with reference to FIG. 1.

The data communicator 1030 includes a data transmitter 1031 and a first interface 1032, for example.

The data transmitter 1031 converts battery information measured by the battery information measurer 120 to data with a format to transmit the battery information to the apparatus 130. For example, the data transmitter 1031 may convert the battery information to data with a format corresponding to a communication protocol used by the apparatus 130. Additionally, the data communicator 1030 may perform buffering of battery information with a predetermined data size, to prevent a data communication from being disconnected or delayed.

The first interface 1032 transmits, to the apparatus 130, the battery information converted by the data communicator 1030. The first interface 1032 may include, for example, a universal serial bus (USB), a controller area network (CAN) bus, a Bluetooth, and an apparatus using a scheme based on a standard of an Institute of Electrical and Electronics Engineers (IEEE), to transmit and receive battery information. Alternate interface methodologies are also available.

A hardware device 1060 of the apparatus 130 includes the communicator 1061 and a processor 1064, for example. The hardware device 1060 also includes a storage 1062 and a bridge 1063, for example.

The apparatus 130 receives the battery information from the BMS 1010 using a receiver, for example, the communicator 1061, and determines the state information based on the received battery information. The apparatus 130 may be separate from the BMS 1010, and may more precisely estimate the state information, e.g., than that directly measured by such a BMS arrangement by itself as discussed above, by analyzing a correlation between data measured from a plurality of battery cells and tracking a history of measured battery information. The state information may include, as only examples, an SOH or an SOC.

The communicator 1061 communicates with the BMS 1010. The communicator 1061 receives the battery information from the BMS 1010 configured to manage the battery pack 1010 including a plurality of battery cells. The communicator 1061 may include a third interface configured to communicate with the first interface 1032 of the data communicator 1030 in the BMS 1010. The third interface may include, for example, an apparatus using the same scheme as the data communicator 1030 (for example, an USB, a CAN, or a Bluetooth). In the present disclosure, the communicator 1061 may be referred to as a receiver.

The processor 1064 processes the battery information received from the BMS 1010. For example, the processor 1064 may perform an operation of each of a platform driver 1050 and a battery state determiner 1040. Also, the processor 1064 may control an operation of each of the communicator 1061, the storage 1062, and the bridge 1063.

The processor 1064 executes instructions to perform an operation of receiving the battery information using the communicator 1061 and determining the state information based on the battery information using a battery degradation model pre-trained on at least one attribute associated with the battery information. In an embodiment, instructions may correspond to applications running on a computing platform.

The bridge 1063 provides a data communication between the processor 1064 and the storage 1062.

The storage 1062 stores the received battery information. For example, the storage 1062 may permanently store, or at least temporarily archive, the received battery information, e.g., for subsequent use in training of one or more degradation models that will be later used for estimating battery state information using subsequently received battery information. Thus, the apparatus 130 may manage a history of the battery based on the battery information stored in the storage 1062.

The second interface 1070 is an interface configured to allow the processor 1064 to perform operations of the platform driver 1050, a preprocessor 1041, and a state estimator 1042. In an example, when the battery state determiner 1040 is implemented by a processing device through an application, the second interface 1070 may be implemented as a device driver. In another example, when the battery state determiner 1040 is implemented as hardware, the second interface 1070 may be implemented as a hardware interface enabling an interaction between hardware components.

The battery state determiner 1040 determines the state information based on the battery information using a battery degradation model. The battery state determiner 1040 may include the preprocessor 1041 and the state estimator 1042, for example. In one or more embodiments, any or any combination of the battery state determiner 1040, the preprocessor 1041, and the state estimator 1042, for example, may be implemented by one or more processing devices through application(s) including corresponding instructions, however, there is no limitation thereto. Similarly, in one or more embodiments, any or any combination of the battery state determiner 1040, the preprocessor 1041, and the state estimator 1042 may be implemented as hardware, e.g., operating under a control of the processor 1064, as shown in FIG. 1, as only an example.

The preprocessor 1041 preprocess the battery information. In an example, the preprocessor 1041 may preprocess the battery information stored in the storage 1062, using a similar scheme to schemes described with reference to FIGS. 3 through 8. Additionally, the preprocessor 1041 may preprocess the battery information classified in operation 330 of FIG. 2.

In one or more embodiments, the preprocessor 1041 may be implemented by hardware or one or more processing devices through application(s) including corresponding instructions to perform an operation by which the processor 1064 classifies battery information, and to perform an operation of generating distribution information by partitioning the battery information into at least one predetermined section and accumulating the at least one predetermined section, an operation of generating segment information by partitioning the battery information into predetermined time segments, and/or an operation of generating frequency information by converting the battery information from a time domain to a frequency domain. Such operations may be alterable and updated based on selection by the user.

The state estimator 1042 estimates the state information from the preprocessed battery information using a battery degradation model. For example, the state estimator 1042 may estimate the state information using a similar scheme to schemes described with reference to FIGS. 3 through 8.

In one or more embodiments, the state estimator 1042 may be implemented by hardware or one or more processing devices through application(s) including corresponding instructions to perform an operation of estimating the state information from the battery information using the battery degradation model and a machine learning structure, such as by using a first degradation model trained on a distribution attribute of the battery information, a second degradation model trained on a time attribute of the battery information, and/or a third degradation model trained on a frequency attribute of the battery information. Such operations may be alterable and updated based on selection by the user.

The above-described applications may vary depending on the computing platform. Also, the applications may include, for example, an artificial intelligence learning application and a verification application. The applications may include instructions to perform an operation to preprocess battery information and estimate a state.

The platform driver 1050 is configured to control the apparatus 130 to execute instructions. The processor 1064 may drive the computing platform as the platform driver 1050. The platform driver 1050 may control the hardware device 1060 to execute the above-described applications. The platform driver 1050 may be a software platform, for example, an operating system (OS). The OS may include, for example, Linux, Windows or Android. The platform driver 1050 may be tuned based on a performance of hardware.

In response to an update signal, the processor 1064 updates at least one of the battery degradation model and instructions. For example, the processor 1064 may update an application on a demand by a user. The battery degradation model and an algorithm used to estimate a state may be updated without a restriction (for example, during an operation of the apparatus 100). The update signal may be received automatically or by a user through the communicator 1061 or a separate input device.

The state information outputter 1090 provides the user with the estimated state information. The state information outputter 1090 may provide the user with the state information by, for example, using an auditory signal output device and a visual signal output device capable of outputting sound, voice or images. The visual signal output device may include both an electronic dashboard and a mechanical dashboard. In an example, when the state information outputter 1090 includes a display, the state information outputter 1090 may display an SOH value corresponding to the state information. The state information outputter 1090 may be positioned in or outside the apparatus 100.

In an example, the apparatus 100 may be applicable to all electronic device embodiments requiring an estimation of a state of a rechargeable battery (for example, a life of the battery). For example, the apparatus 100 may be applicable to a vehicle embodiment for transportation using a battery as an energy source or another electronic device embodiment using a battery as an energy source.

The apparatuses, units, modules, devices, and other components illustrated in FIGS. 1 and 9 that may perform the operations described herein with respect to FIGS. 2-3, 5, and 7, for example, are implemented by hardware components. Examples of hardware components include controllers, sensors, memory, drivers, and any other electronic components known to one of ordinary skill in the art. In one example, the hardware components are implemented by one or more processing devices, or processors, or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer and that may control the processor or computer to implement one or more methods described herein. Hardware components implemented by a processor or computer execute instructions or software, such as an operating system (OS) and one or more software applications that run on the OS, to perform the operations described herein with respect to FIGS. 2-3, 5, and 7, for example. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2-3, 5, and 7 that perform the operations described herein may be performed by a processor or a computer as described above executing instructions or software to perform the operations described herein.

Instructions or software to control a processor or computer to implement the hardware components and perform the methods as described above may be written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Based on the disclosure herein, and after an understanding of the same, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components, such as discussed in any of FIGS. 1 and 9, and perform the methods as described above in any of FIGS. 2-3, 5, and 7, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

As a non-exhaustive example only, an electronic device embodiment herein, e.g., that includes an apparatus for determining state information of a battery pack, as described herein may be a vehicle, a mobile device, such as a cellular phone, a smart phone, a wearable smart device, a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:

1. An apparatus for determining state information of a battery pack, the apparatus comprising:
   a receiver configured to receive measured battery information of the battery pack comprising any one or any combination of any two or more of a voltage, a current, and a temperature of the battery pack; and one or more processors configured to:
generate first information by any one or any combination of any two or more of partitioning the received battery information based on ranges of battery information values, partitioning the received battery information based on time segments during which the battery information is measured, and converting the received battery information from a time domain to a frequency domain;
estimate the state information from the generated first information using a battery degradation model generated, through training, based on attributes associated with a battery information usage history of the battery pack, the attributes including any one or any combination of any two or more of a distribution attribute, a time attribute, and a frequency attribute; and
control any one or any combination of any two or more of the voltage, the current, and the temperature of the battery pack based on the estimated state information.

2. The apparatus of claim 1, wherein the one or more processors are further configured to:
classify the received battery information corresponding to a predetermined period among the received battery information, and
estimate the state information from the classified battery information.

3. The apparatus of claim 2, wherein the one or more processors are further configured to perform either one or both of clustering of the received battery information, in a unit of a predetermined data size, and archiving of the received battery information in a predetermined time unit.

4. The apparatus of claim 1, wherein the generated battery degradation model comprises a first degradation model generated through the training on a distribution attribute associated with the received battery information based on reference distribution information obtained by partitioning previously received battery information from the battery into at least one predetermined section and accumulating the at least one predetermined section, and
wherein the one or more processors are further configured to:
generate distribution information by accumulating the generated first information; and
estimate the state information from the generated distribution information using the first degradation model.

5. The apparatus of claim 1, wherein the generated battery degradation model comprises a second degradation model generated through the training on a time attribute associated with the received battery information based on reference segment information obtained by partitioning previously received battery information from the battery into predetermined time segments, and
wherein the one or more processors are further configured to:
generate the first information by partitioning the received battery information based on time segments during which the battery information is measured; and
estimate the state information from the generated first information using the second degradation model.

6. The apparatus of claim 1, wherein the generated battery degradation model comprises a third degradation model generated through the training on a frequency attribute associated with the received battery information based on reference frequency information obtained by converting previously received battery information from the battery from a time domain to a frequency domain, and
wherein the one or more processors are further configured to:
generate the first information by convening the received battery information from the time domain to the frequency domain; and
estimate the state information from the generated first information using the third degradation model.

7. The apparatus of claim 1, wherein:
the generated battery degradation model comprises one or more of a first degradation model, a second degradation model, and a third degradation model,
the first degradation model is trained on a distribution attribute, associated with the received battery information, based on reference distribution information obtained by partitioning previously received battery information into at least one predetermined section and accumulating the at least one predetermined section,
the second degradation model is trained on a time attribute, associated with the received battery information, based on reference segment information obtained by partitioning the previously received battery information into predetermined time segments, and
the third degradation model is trained on a frequency attribute, associated with the received battery information, based on reference frequency information obtained by converting the previously received battery information from a time domain to a frequency domain.

8. The apparatus of claim 1, wherein the one or more processors are further configured to generate the battery degradation model, through pre-training, based on the result of pre-processing with attributes associated with received battery information of the battery pack, the attributes including the one or more of the distribution attribute, the time attribute, and the frequency attribute.

9. The apparatus of claim 1, wherein, for the managing of the battery pack, the one or more processors are configured to output information corresponding to the estimated state information to a user through a display.

10. A processor-implemented method of determining state information of a battery pack, the method comprising:
receiving, using a receiver, measured battery information of the battery pack comprising any one Or any combination of any two or more of a voltage, a current, and a temperature of the battery pack;
generating, using one or more processors, first information by any one or any combination of any two or more of partitioning the received battery information based on ranges of battery information values, partitioning the received battery information based on time segments during which the battery information is measured, and converting the received battery information from a time domain to a frequency domain;
estimating, using the one or more processors, the state information from the generated first information using a battery degradation model generated, through training, based on attributes associated with a battery information usage history of the battery pack, the attributes including any one or any combination of any two or more of a distribution attribute, a time attribute, and a frequency attribute; and
controlling, using the one or more processors, any one or any combination of any two or more of the voltage, the current, and the temperature of the battery pack based on the estimated state information.

11. The method of claim 10, further comprising:
classifying the received battery information corresponding to a predetermined period among the received battery information, and
estimating the state information from the classified battery information.

12. The method of claim 11, wherein the classifying comprises performing either one or both of clustering of the received battery information in a unit of a predetermined data size and archiving of the received battery information in a predetermined time unit.

13. The method of claim 10, further comprising:
generating distribution information by accumulating the generated first information; and
estimating the state information from the generated distribution information using a first degradation model generated through the training on a distribution attribute, from previously received battery information, associated with the received battery information.

14. The method of claim 10, further comprising:
generating the first information by partitioning the received battery information based on time segments during which the battery information is measured; and
estimating the state information from the generated first information using a second degradation model generated through the training on a time attribute, from previously received battery information, associated with the received battery information.

15. The method of claim 10, further comprising:
generating the first information by converting the received battery information from the time domain to the frequency domain; and
estimating the state information from the generated first information using a third degradation model generated through the training on a frequency attribute, from previously received battery information, associated with the received battery information.

16. The method of claim 10, further comprising generating the battery degradation model, through pre-training, based on the result of pre-processing with attributes associated with received battery information of the battery pack, the attributes including the one or more of the distribution attribute, the time attribute, and the frequency attribute.

17. An apparatus configured to estimate state information of a battery, the apparatus comprising:
a receiver configured to receive, from a battery management system (BMS), measured battery information of the battery comprising any one or any combination of any two or more of a voltage, a current, and a temperature of the battery; and
one or more processors configured to execute instructions to perform one or more operations, including:
generating first information by any one or any combination of any two or more of partitioning the received battery information based on ranges of battery information values, partitioning the received battery information based on time segments during which the battery information is measured, and converting the received battery information from a time domain to a frequency domain;
determining the state information of the battery estimated based on the generated first information using a battery degradation model generated, through training, based on attributes associated with a battery information usage history of the battery, the attributes including any one or any combination of any two or more of a distribution attribute, a time attribute, and a frequency attribute; and
controlling any one or any combination of any two or more of the voltage, the current, and the temperature of the battery based on the determined state information.

18. The apparatus of claim 17, further comprising the BMS configured to measure battery information associated with a battery pack comprising a plurality of battery cells and configured to transmit the measured battery information to the communicator, the BMS comprising the battery pack.

19. The apparatus of claim 18, wherein the BMS comprises a battery information measurer configured to measure at least one of a voltage, a current, and a temperature of each of the plurality of battery cells.

20. The apparatus of claim 17, wherein the one or more processors are configured to drive a computing platform configured to control the apparatus to execute the instructions.

21. The apparatus of claim 17, wherein the one or more processors are configured to update at least one of the instructions and the battery degradation model, in response to an update signal.

22. The apparatus of claim 17, wherein the processor is configured to execute instructions to perform an operation of generating distribution information by partitioning the received battery information into at least one predetermined section and accumulating the at least one predetermined section and of estimating the state information from the generated distribution information using a first degradation model generated through the training on a distribution attribute, from previously received battery information, associated with the received battery information.

23. The apparatus of claim 17, wherein the processor is configured to execute instructions to perform an operation of generating segment information by partitioning the received battery information into predetermined time segments and of estimating the state information from the generated segment information using a second degradation model generated through the training on a time attribute, from previously received battery information, associated with the received battery information.

24. The apparatus of claim 17, wherein the processor is configured to execute instructions to perform an operation of generating frequency information by converting the received battery information from a time domain to a frequency domain and of estimating the state information from the generated frequency information using a third degradation model generated through the training on a frequency attribute, from previously received battery information, associated with the received battery information.

25. The apparatus of claim 17, wherein the one or more processors are configured to execute instructions to perform the one or more operations further including generating the battery degradation model, through pre-training, based on the result of pre-processing with attributes associated with received battery information of the battery pack, the attributes including the one or more of the distribution attribute, the time attribute, and the frequency attribute.

* * * * *